(12) United States Patent
Lu et al.

(10) Patent No.: US 8,339,831 B2
(45) Date of Patent: Dec. 25, 2012

(54) SINGLE POLYSILICON NON-VOLATILE MEMORY

(75) Inventors: Hau-Yan Lu, Kaohsiung (TW); Ching-Sung Yang, Hsinchu (TW); Shih-Chen Wang, Taipei (TW); Hsin-Ming Chen, Hsinchu (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 223 days.

(21) Appl. No.: 12/899,562

(22) Filed: Oct. 7, 2010

(65) Prior Publication Data
US 2012/0087170 A1    Apr. 12, 2012

(51) Int. Cl.
*G11C 17/00*    (2006.01)
(52) U.S. Cl. .................. 365/102; 365/189.06; 365/103; 365/94; 365/96; 365/104; 365/149; 365/174; 365/186; 365/189.011; 365/189.15
(58) Field of Classification Search .................. 365/102, 365/189.06, 103, 94, 96, 104, 149, 174, 186, 365/189.011, 189.15
See application file for complete search history.

(56) References Cited

U.S. PATENT DOCUMENTS

| | | | |
|---|---|---|---|
| 6,700,151 B2 | 3/2004 | Peng | |
| 7,402,855 B2 | 7/2008 | Kurjanowicz | |
| 2004/0100850 A1 | 5/2004 | Novosel | |
| 2009/0285041 A1* | 11/2009 | Ito | ............. 365/189.16 |
| 2010/0182819 A1 | 7/2010 | Matsufuji | |

* cited by examiner

*Primary Examiner* — Fernando Hidalgo
(74) *Attorney, Agent, or Firm* — Winston Hsu; Scott Margo

(57) ABSTRACT

A one-time-programmable memory device comprises a one-time-programmable memory cell array, a voltage pumping circuit, and a programming verification circuit. The one-time-programmable memory cell array comprises a plurality of memory cells. Each memory cell is arranged at an intersection of a bit line and a word line. The voltage pumping circuit comprises a plurality of local voltage boost circuits. Each local voltage boost circuit is shared by a corresponding memory cell of the plurality of memory cells. The programming verification circuit is coupled to the one-time-programmable memory cell array for verifying that conduction current of programmed memory cells of the plurality of memory cells is greater than a predetermined current level after programming. Each local boost circuit isolates leakage current of a corresponding programmed memory cell, and prevents programming voltage failure due to current overloading at a corresponding voltage pumping circuit.

15 Claims, 12 Drawing Sheets

SINGLE POLYSILICON NON-VOLATILE MEMORY

BACKGROUND OF THE INVENTION

1. Field of the Invention

The present invention relates to non-volatile memory, and particularly to a single-poly non-volatile memory.

2. Description of the Prior Art

Non-volatile memory is a type of memory that retains information it stores even when no power is supplied to memory blocks thereof. Some examples include magnetic devices, optical discs, flash memory, and other semiconductor-based memory topologies. Some forms of non-volatile memory have bits defined in fabrication, some may be programmed only once (one time programmable ROM, OTP ROM), and other types may be programmed and reprogrammed many times over. As semiconductor memory technologies have matured, one advantage that has come out of development of such technologies is the ability to integrate substantial amounts of memory cells in integrated circuits (ICs). However, it is desirable that the memory cells be formed in the same process with the ICs.

Please refer to FIG. 1, which is a diagram of a non-volatile memory cell 10. A select transistor polysilicon 100 and a metal-oxide-semiconductor capacitor polysilicon 110 are formed over a substrate 150. Sidewall layers 101, 102 are formed next to the select gate polysilicon 100 and the metal-oxide-semiconductor capacitor (MOSc) polysilicon 110, respectively, over lightly-doped drain (LDD) regions 120 and N+ regions 130, 131 implanted in the substrate 150. A bit line 140 is electrically connected to the N+ region 131. After programming with high voltage, a conduction path is formed under the MOSc polysilicon 110. However, the conduction path under the MOSc polysilicon 110 is randomly located at a junction edge or at the substrate 150.

Please refer to FIG. 2, which is a diagram illustrating a high voltage power failure in a non-volatile memory cell array 20 comprising non-volatile memory cells such as the non-volatile memory cell 10 of FIG. 1. As shown in FIG. 2, leakage current I* generated by fast bits causes high voltage power failure for slow bits on the same power line. Word line voltages $V_{WL}1$, $V_{WL}2$, power line voltages $V_{PL}1$, $V_{PL}2$, and bit line voltages $V_{BL}1$, $V_{BL}2$, $V_{BL}3$ are applied to the non-volatile memory cells. When the power line voltage $V_{PL}1$ is equal to a first voltage $V_{PP}$, the word line voltage $V_{WL}1$ is equal to half the first voltage $V_{PP}/2$, and the bit line voltage $V_{BL}2$ is equal to half the first voltage $V_{PP}/2$, the leakage current I* is generated at the fast bit 21, which causes power line voltage seen at the slow bit 23 to equal a reduced first voltage $V_{PP}^* = V_{PP} - \Delta V = V_{PP} - I^* \cdot R$. The reduced first voltage $V_{PP}^*$ causes high voltage power failure for the slow bit 23 on the same power line as the fast bit 21.

SUMMARY OF THE INVENTION

According to an embodiment, a one-time-programmable memory device comprises a one-time-programmable memory cell array, a voltage pumping circuit, and a programming verification circuit. The one-time-programmable memory cell array comprises a plurality of memory cells, each memory cell of the plurality of memory cells arranged at an intersection of a bit line and a word line. The voltage pumping circuit comprises a plurality of local voltage boost circuits, each local voltage boost circuit of the plurality of local voltage boost circuits shared by a corresponding memory cell of the plurality of memory cells. The programming verification circuit is coupled to the one-time-programmable memory cell array for verifying that conduction current of programmed memory cells of the plurality of memory cells is greater than a predetermined current level after programming. Each local boost circuit isolates leakage current of a corresponding programmed memory cell, and prevents programming voltage failure due to current overloading at a corresponding voltage pumping circuit.

According to another embodiment, a one-time-programmable memory device comprises a one-time-programmable memory cell array, a non-volatile memory device, a voltage pumping circuit, and a programming verification circuit. The one-time-programmable memory device comprises a plurality of memory cells. Each memory cell of the plurality of memory cells is arranged at an intersection of a bit line and a word line. The non-volatile memory device comprises a first gate formed on a surface of the substrate, a second gate formed on the surface of the substrate, a first diffusion region of a second conductivity type different than the first conductivity type formed on a side of the first gate, a second diffusion region of the second conductivity type formed on another side of the second gate, and a middle diffusion region of the second conductivity type formed between the first gate and the second gate. The second diffusion region merges with the middle diffusion region under the second gate, and the first diffusion region is separate from the middle diffusion region. The voltage pumping circuit comprises a plurality of local voltage boost circuits, each local voltage boost circuit of the plurality of local voltage boost circuits shared by a corresponding memory cell of the plurality of memory cells. The programming verification circuit is coupled to the one-time-programmable memory cell array for verifying that conduction current of programmed memory cells of the plurality of memory cells is greater than a predetermined current level after programming. Each local boost circuit isolates leakage current of a corresponding programmed memory cell, and prevents programming voltage failure due to current overloading at a corresponding voltage pumping circuit.

According to another embodiment, a one-time-programmable memory device comprises a one-time-programmable memory cell array, a non-volatile memory device, a voltage pumping circuit, and a programming verification circuit. The one-time-programmable memory cell array comprises a plurality of memory cells, each memory cell of the plurality of memory cells arranged at an intersection of a bit line and a word line. The non-volatile memory device is formed on and in a substrate of a first conductivity type, and comprises a first gate formed on a surface of the substrate, a second gate formed on the surface of the substrate, a first diffusion region of a second conductivity type different than the first conductivity type formed on a side of the first gate, a middle diffusion region of the second conductivity type formed between the first gate and the second gate, and a well region of the second conductivity type formed under the second gate and the middle diffusion region. The voltage pumping circuit comprises a plurality of local voltage boost circuits, each local voltage boost circuit of the plurality of local voltage boost circuits shared by a corresponding memory cell of the plurality of memory cells. A programming verification circuit coupled to the one-time-programmable memory cell array for verifying that conduction current of programmed memory cells of the plurality of memory cells is greater than a predetermined current level after programming. Each local boost circuit isolates leakage current of a corresponding programmed memory cell, and prevents programming voltage failure due to current overloading at a corresponding voltage pumping circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
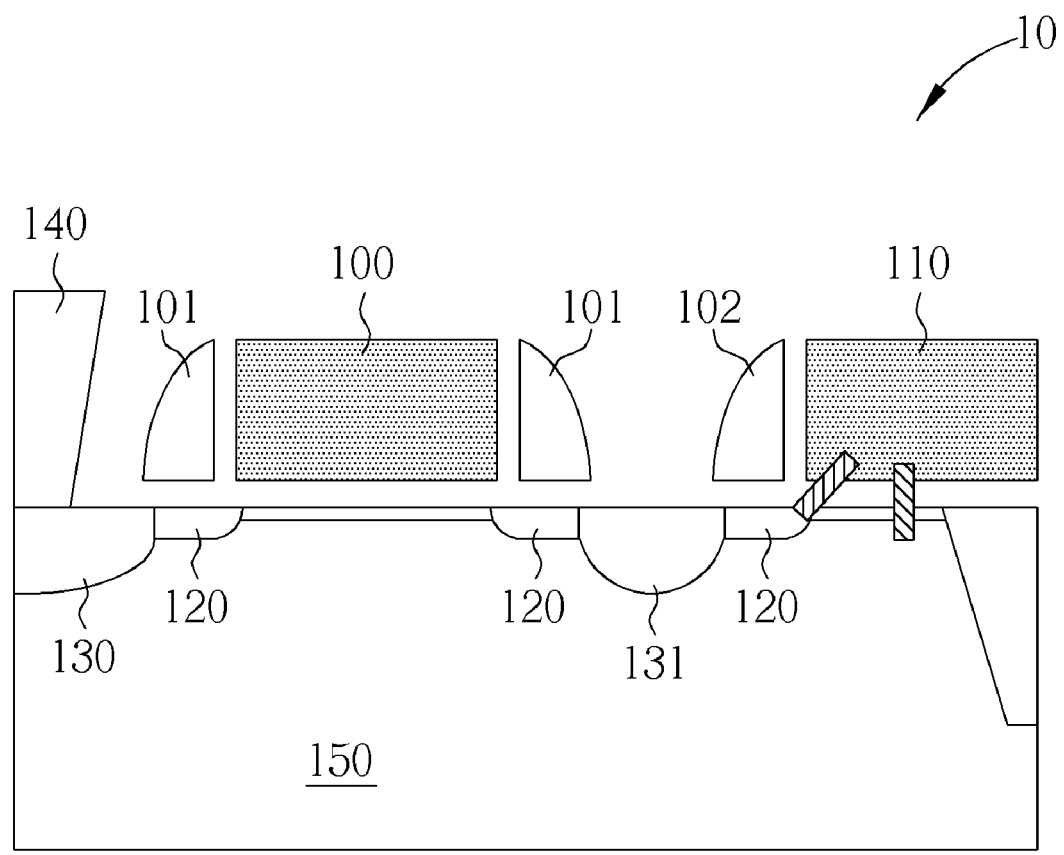
FIG. 1 is a diagram of a non-volatile memory cell according to the prior art.
Figure 2:
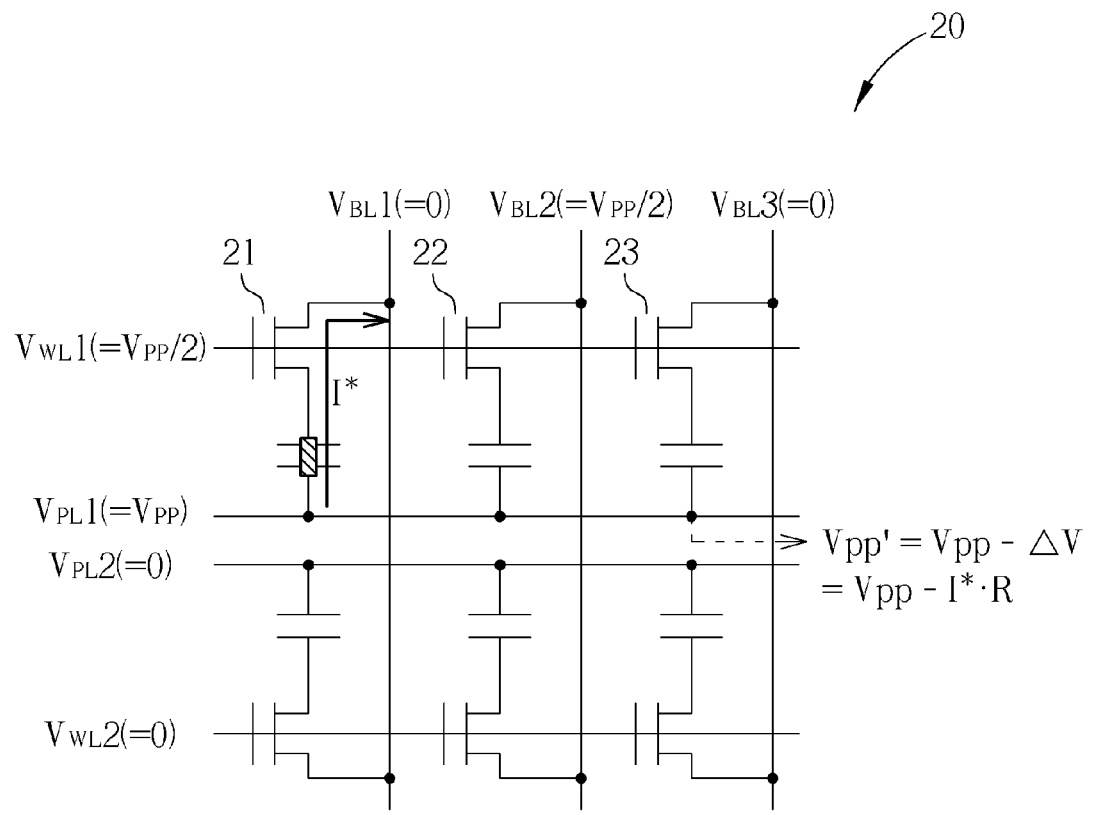
FIG. 2 is a diagram illustrating a high voltage power failure in a non-volatile memory cell array according to the prior art.
Figure 3:
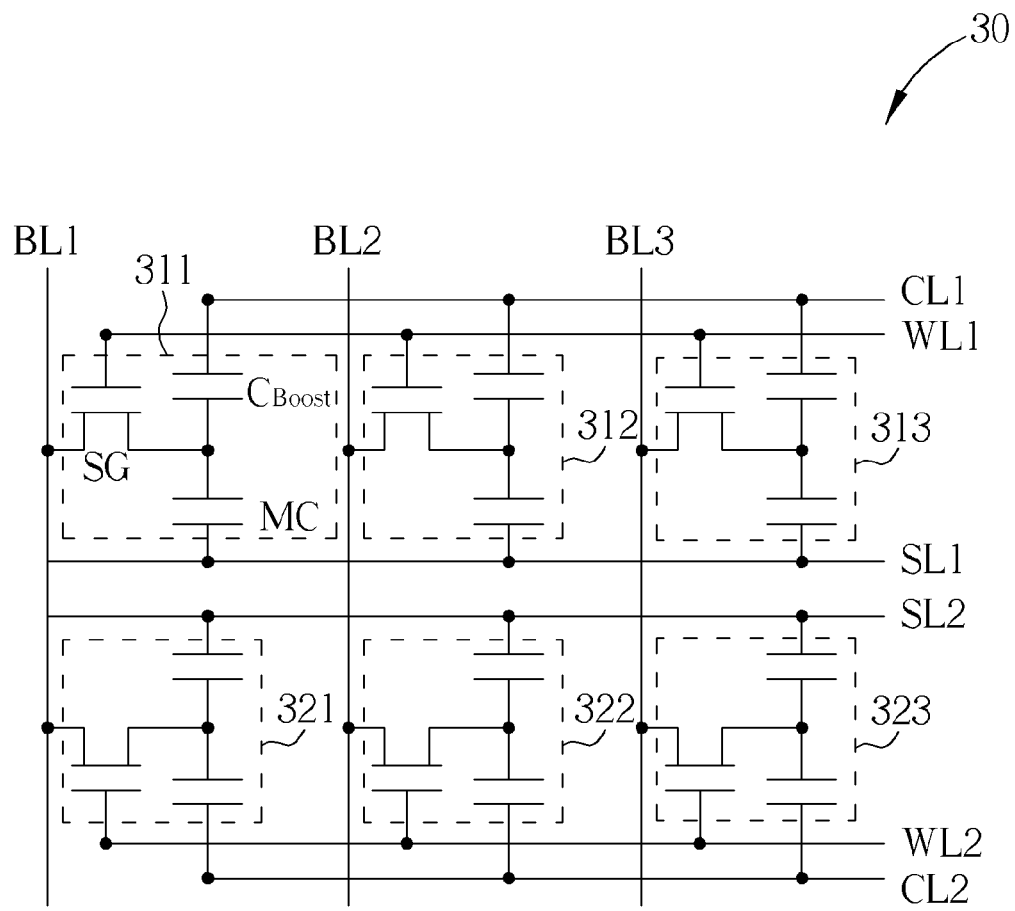
FIG. 3 is a diagram of a non-volatile memory cell array comprising non-volatile boost programming cells according to one embodiment.

Please refer to FIG. 3, which is a diagram of a non-volatile memory cell array 30 comprising non-volatile self-boost programming cells 311, 312, 313, 321, 322, 323 according to one embodiment. Each non-volatile self-boost programming cell of the non-volatile memory cell array 30 comprises a select gate transistor SG, a metal-oxide-semiconductor capacitor (MOSc) MC, and a boost capacitor $C_{Boost}$. Source terminals of the select gate transistors SG are electrically connected to bit lines BL1, BL2, BL3, respectively. Gate terminals of the select gate transistors SG are electrically connected to word lines WL1, WL2, respectively. Each boost capacitor $C_{Boost}$ has a first terminal electrically connected to a control line CL1, CL2, respectively. Each MOSc MC has a first terminal electrically connected to a source line SL1, SL2, respectively. A second terminal of each boost capacitor $C_{Boost}$ is electrically connected to a second terminal of each MOSc MC and a drain terminal of each select gate transistor SG, respectively.

Figure 4:
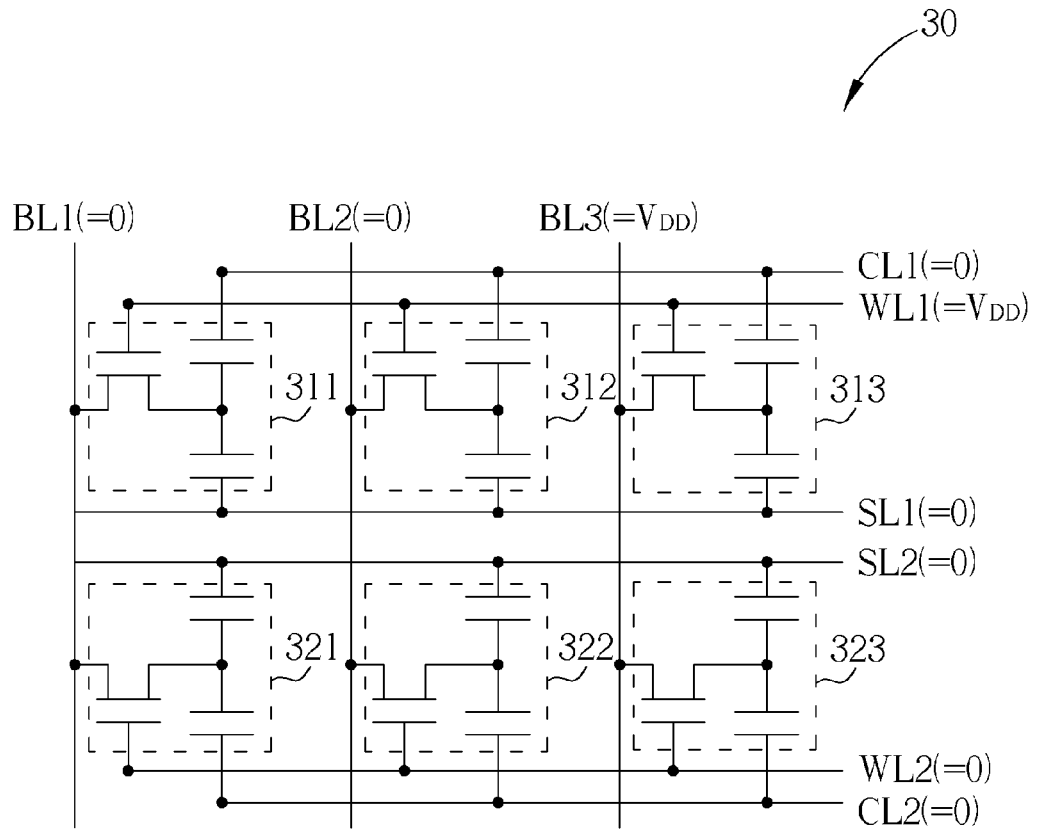
FIG. 4 is a diagram illustrating a precharge operation performed on the non-volatile memory cell array of FIG. 3.

Please refer to FIG. 4, which is a diagram illustrating a pre-charge operation performed on the non-volatile memory cell array of FIG. 3. For programming a selected cell, word line voltage of the selected cell is a drain voltage $V_{DD}$, and bit line voltage of the selected cell is a ground voltage, e.g. 0 Volts. As shown in FIG. 4, for example, the word line WL1 and the control line CL1 are selected, thereby selecting a memory cell comprising the non-volatile memory cells 311, 312, 313. To program to a first logic state, e.g. logic "0", bit line voltage of a selected bit line may be set to 0 Volts. To program to a second logic state, e.g. logic "1", bit line voltage of the selected bit line may be set to the drain voltage $V_{DD}$. In the example shown in FIG. 4, the bit lines BL1 and BL2 are set to 0 Volts, and the bit line BL3 is set to the drain voltage $V_{DD}$. Thus, the non-volatile memory cells 311, 312 are programmed to logic "0", and the non-volatile memory cell 313 is programmed to logic "1". Mapping of the first logic state to logic "0" and the second logic state to logic "1" represents only one configuration, and may be reversed without affecting function of the non-volatile memory cell array 30.

Figure 5:
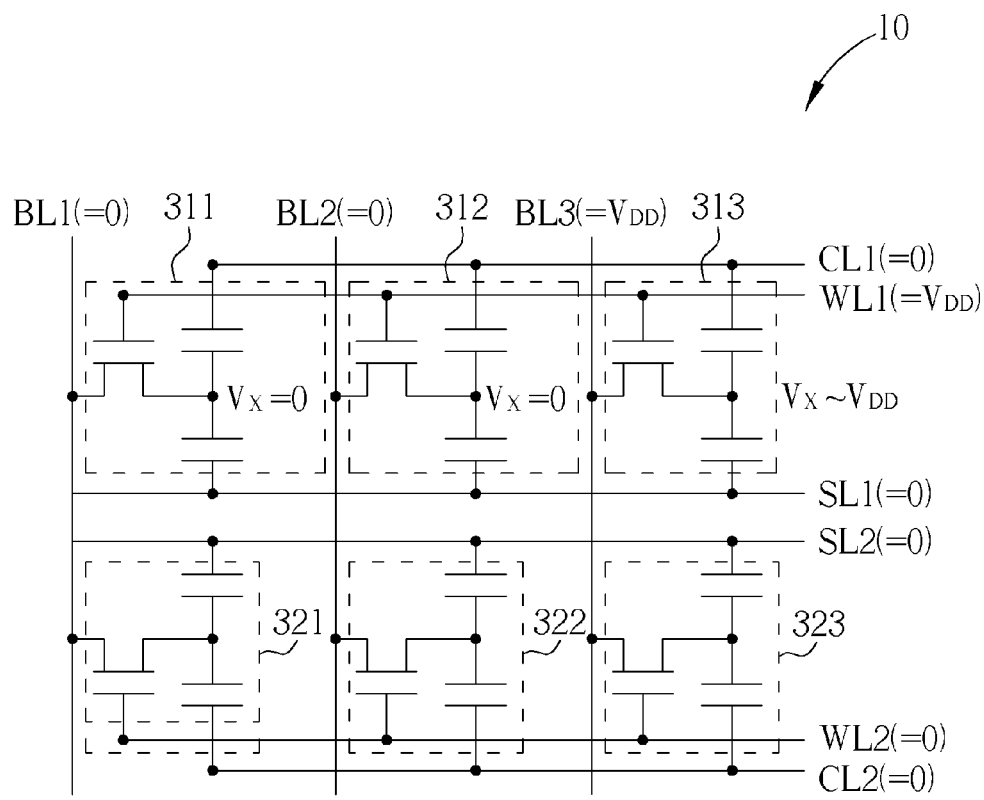
FIG. 5 is a diagram illustrating a first stage of the precharge operation performed on the non-volatile memory cell array of FIG. 3.
Figure 6:
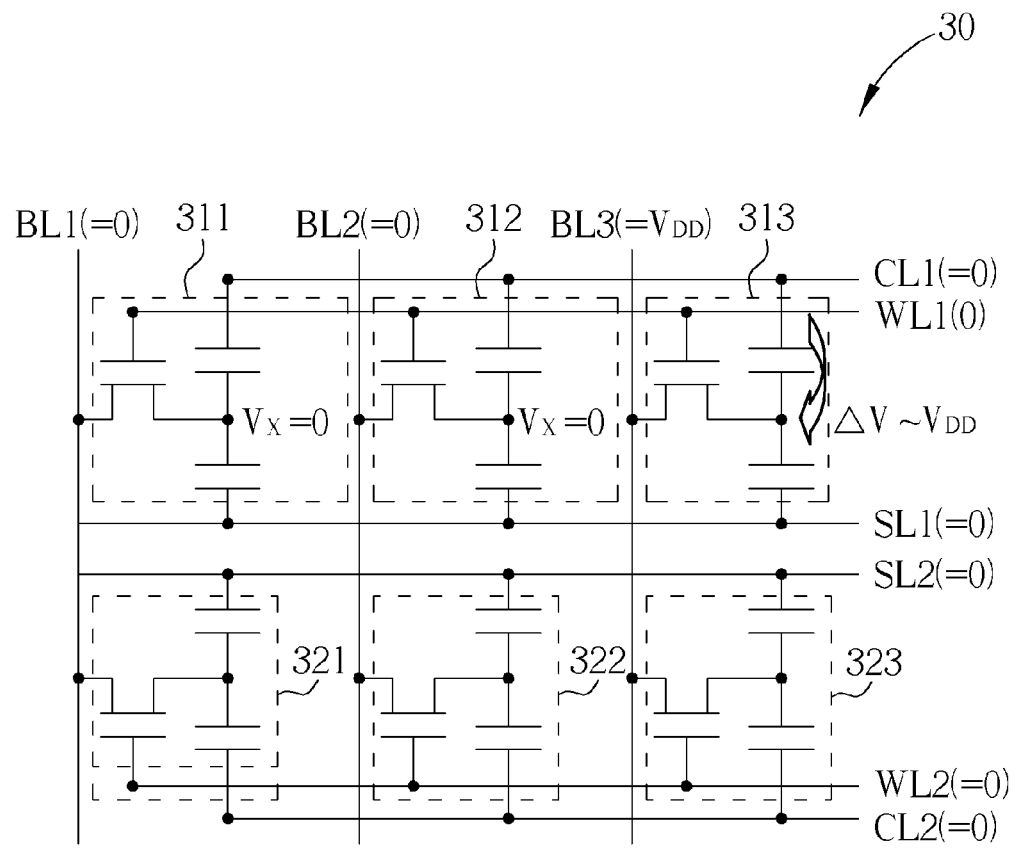
FIG. 6 is a diagram illustrating a second stage of the precharge operation performed on the non-volatile memory cell array of FIG. 3.
Figure 7:
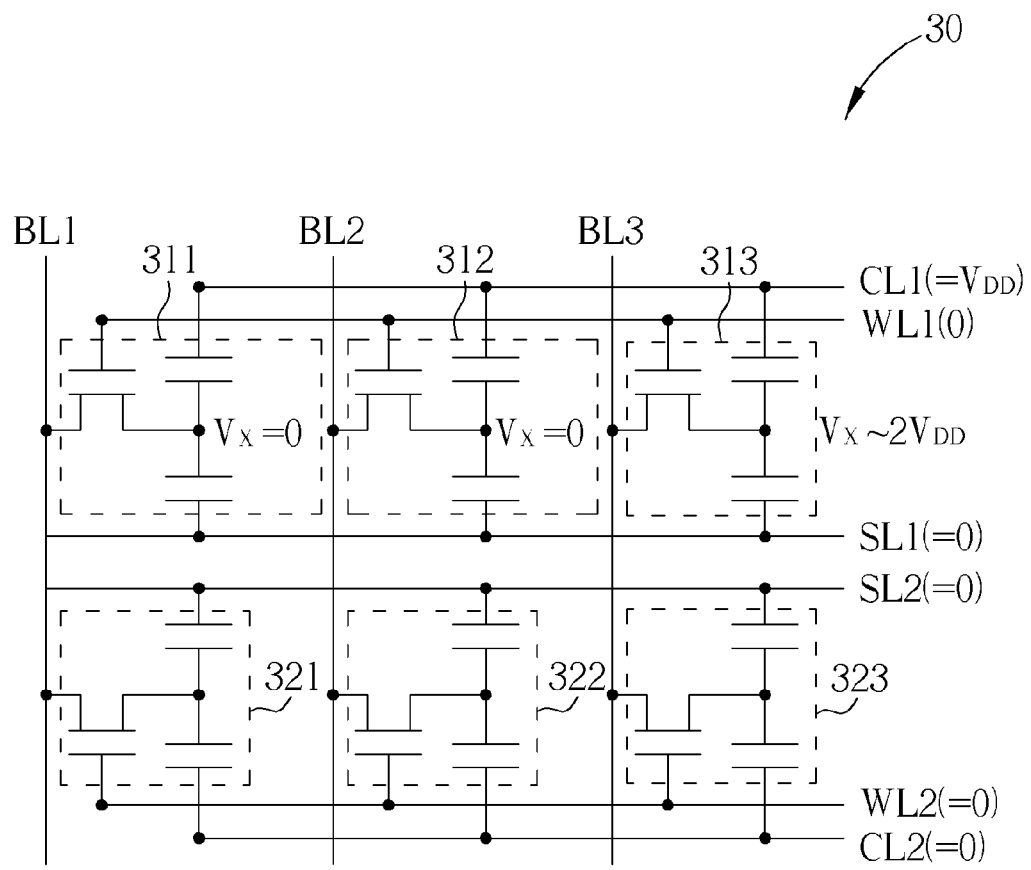
FIG. 7 is a diagram illustrating a programming operation performed on the non-volatile memory cell array of FIG. 3.
Figure 8:
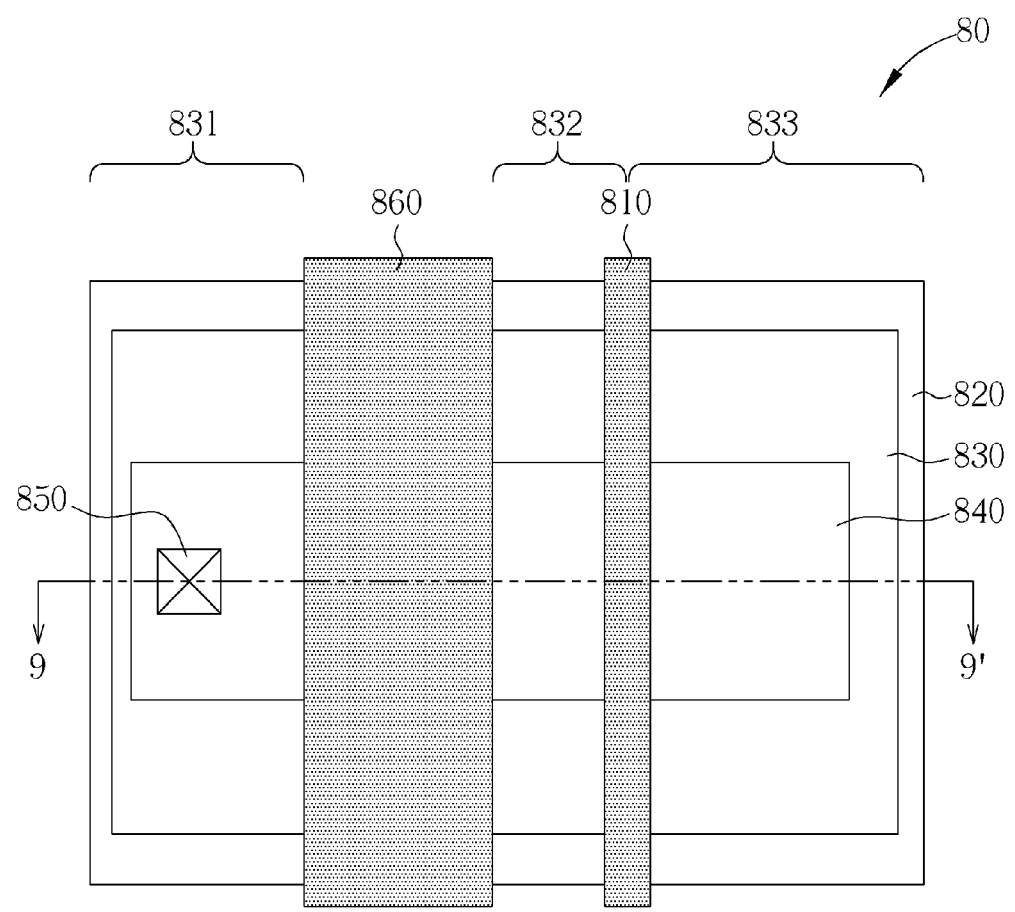
FIG. 8 is a diagram of a non-volatile memory (NVM) cell according to an embodiment.

Please refer to FIG. 5 and FIG. 6, which are diagrams illustrating a first stage and a second stage of the pre-charge operation performed on the non-volatile memory cell array 50 of FIG. 5. Referring to FIG. 7, in the first stage, voltage at the second terminals of the boost capacitor $C_{Boost}$ and the MOSc MC of the non-volatile memory cells 311, 312 is 0 Volts. Voltage at the second terminals of the boost capacitor $C_{Boost}$ and the MOSc MC of the non-volatile memory cell 313 is approximately equal to the drain voltage $V_{DD}$. Referring to FIG. 8, after the first stage is completed, the selected word line WL1 is turned off, e.g. set to 0 Volts. Thus, a voltage difference equal to approximately the drain voltage $V_{DD}$ is stored in the boost capacitor $C_{Boost}$ of the non-volatile memory cell 313.

Please refer to FIG. 7, which is a diagram illustrating a programming operation performed on the non-volatile memory cell array 30 of FIG. 3. After the pre-charge operation is completed, a programming period ensues, during which control line voltage of a selected control line is set to the program voltage $V_{DD}$. For example, as shown in FIG. 7, the control line CL1 is set to the program voltage $V_{DD}$. In this way, the voltage at the second terminals of the boost capacitor $C_{Boost}$ and the MOSc MC is boosted to approximately two times the stored voltage $V_{DD}$, which induces oxide rupture in the MOSc MC.

Figure 12:
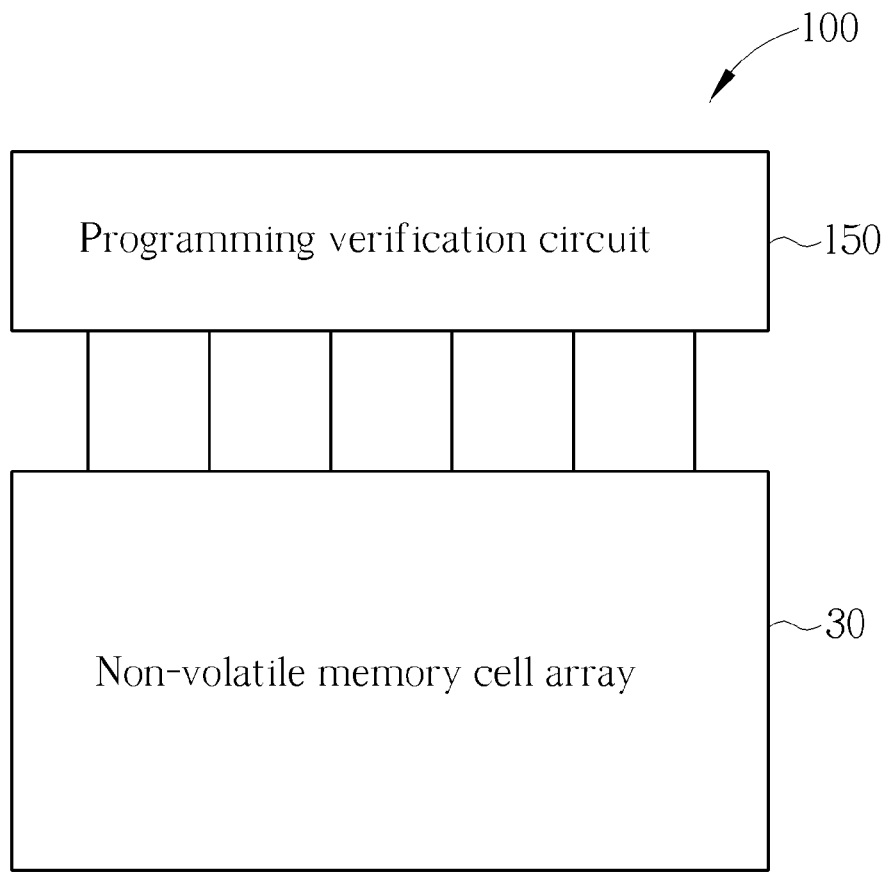
FIG. 12 illustrates a one-time-programmable memory device according to one embodiment of the present invention.

Please refer to FIG. 12, which illustrates a one-time-programmable memory device 100 according to one embodiment of the present invention. In addition to the above, as shown in FIG. 12, the one-time-programmable memory device 100 comprising the non-volatile memory cell array 30 may further comprise a programming verification circuit 150. Furthermore, a voltage pumping circuit is formed inside the non-volatile memory cell array 30 by the boost capacitor $C_{boost}$ of each of the memory cells 311, 312, 313, 321, 322 and 323. The programming verification circuit 150 is coupled to each of the memory cells 311, 312, 313, 321, 322 and 323 included by the one-time-programmable memory cell array 30 for verifying that conduction current of programmed memory cells of the plurality of memory cells 30 is greater than a predetermined current level after programming. Each of the boost capacitor $C_{boost}$ of each of the memory cells 311, 312, 313, 321, 322 and 323—isolates leakage current of a corresponding programmed memory cell, and prevents programming voltage failure due to current overloading at a corresponding boost capacitor $C_{boost}$. Each memory cell of the plurality of memory cells 30 may be a resistance adjustable device, such as a metal-oxide-semiconductor capacitor, which may be a short channel source-drain region merged type capacitor.

Figure 9:
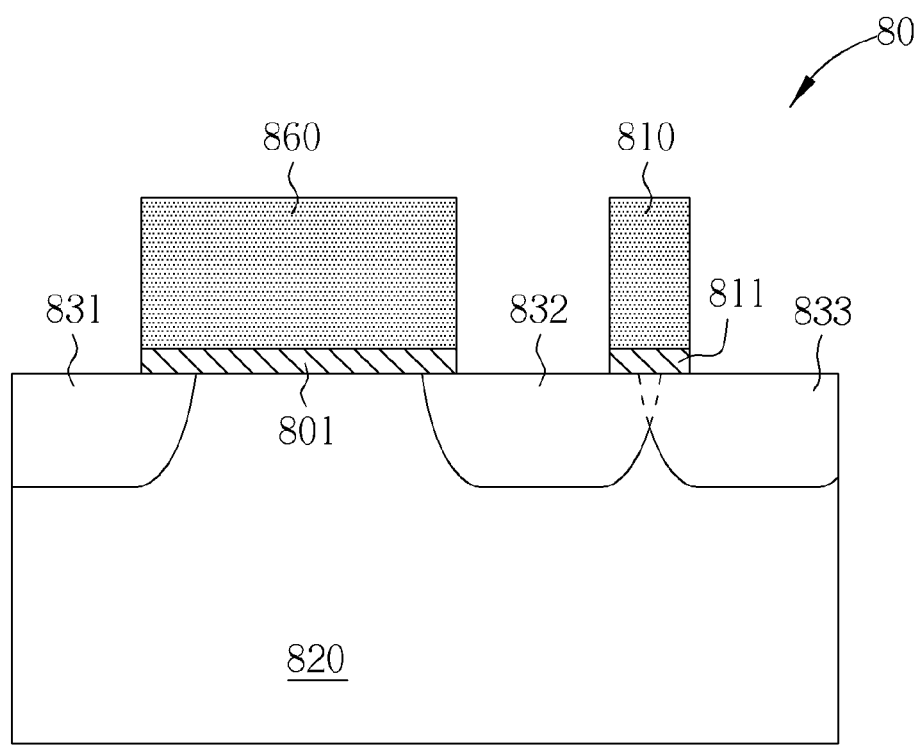
FIG. 9 is a cross-sectional diagram of the NVM cell along the line 9-9' of FIG. 8.

Please refer to FIG. 8 and FIG. 9. FIG. 8 is a diagram of a non-volatile memory (NVM) cell 80 according to an embodiment. FIG. 9 is a cross-sectional diagram of the NVM cell 80 along the line 9-9' of FIG. 8. The NVM cell 80 may be formed on an input/output (I/O) well 820 of a first conductivity type on a substrate. The I/O well 820 may be a lightly doped well relative to wells utilized for core circuits, which may be more heavily doped. An active region 840 may be defined in the I/O well 820. A first gate 860 and a second gate 810 may be formed over the active region 840. A first gate oxide layer 801 may be formed between the first gate 860 and the substrate, and a second gate oxide layer 811 may be formed between the second gate 810 and the substrate. Diffusion regions 830, including a first diffusion region 831, a second diffusion region 833, and a middle diffusion region 832, may be implanted as follows. The first gate 860 and the second gate 810 may be separated by a distance sufficient for forming the middle diffusion region 832 therebetween. The first gate 860 may be sufficiently long to form the first diffusion region 831 in the I/O well 820 on a side of the first gate 860 opposite the middle diffusion region 832 without the first diffusion region 831 and the middle diffusion region 832 merging. The second diffusion region 833 may be formed in the I/O well 820 on a side of the second gate 810 opposite the middle diffusion region 832. The second gate 810 may be sufficiently short to allow merging of the second diffusion region 833 and the middle diffusion region 832 under the second gate 810. For example, the first gate 860 may have length defined by an I/O rule, and the second gate 810 may have a shortest length allowed by a fabrication process used for fabricating the NVM cell 80. For example, the first gate 860 may have length in a range of 250 to 350 nanometers, and the second gate 810 may have length of 60 nanometers or 90 nanometers, depending on the fabrication process. In some embodiments, the I/O well 820 may be a lightly doped p-type well, and the diffusion regions 830 may be N+ diffusion regions. Doping concentration of the I/O well 820 may be used for metal-oxide-semiconductor field effect transistors (MOSFETs) having at least one thick gate oxide. The merging may be intrinsic merging, where no external electric field is required to cause a punch-through effect. The second diffusion region 833 and the middle diffusion region 832 may be considered intrinsically punch-through.

Figure 10:
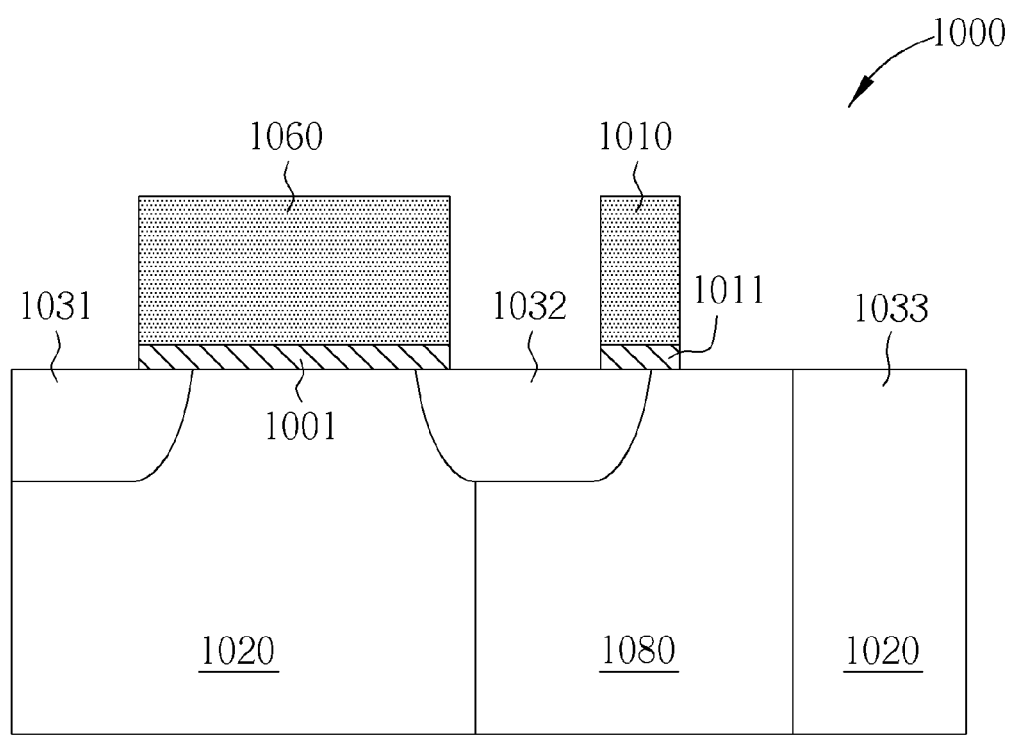
FIG. 10 is a diagram of an NVM cell according to another embodiment.
Figure 11:
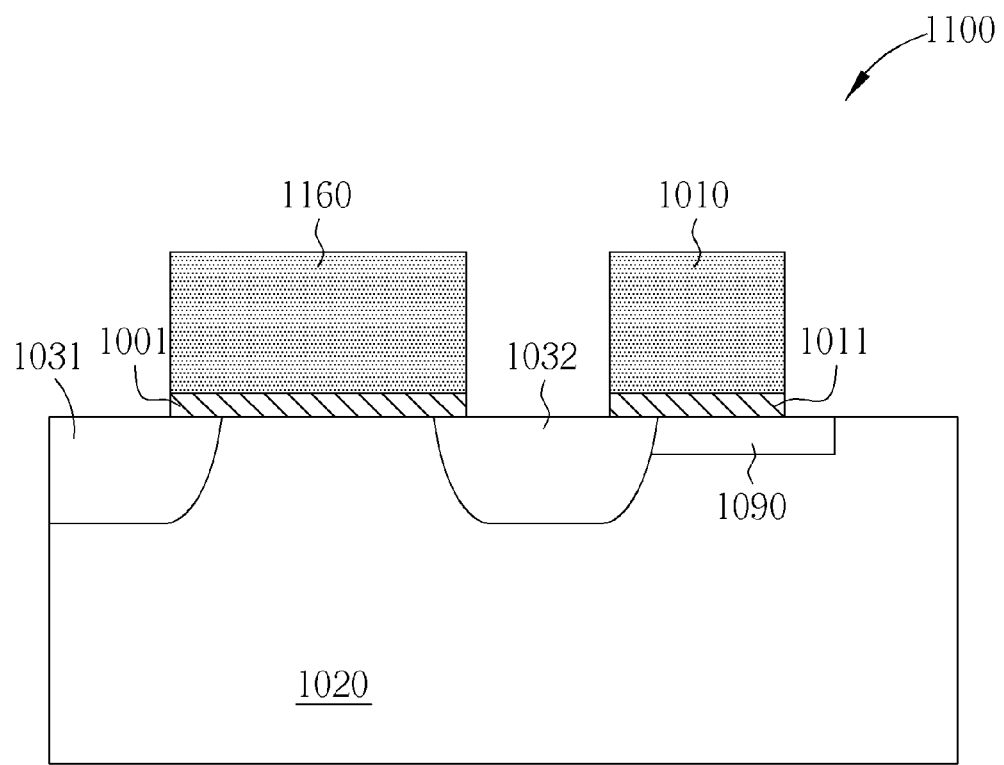
FIG. 11 is a diagram of an NVM cell according to another embodiment.

Please refer to FIG. 10 and FIG. 11. FIG. 10 is a diagram of an NVM cell 1000, and FIG. 11 is a diagram of an NVM cell 1100. Similar reference numerals of the NVM cell 30, the NVM cell 1000 and/or the NVM cell 1100 represent similar elements. In the NVM cell 1000, an n-well 1080 may be formed under the second gate 1010 and the middle diffusion region 1032. In the NVM cell 1100, a threshold voltage ($V_{TH}$) adjustment implantation region 1090 may be formed under the second gate 1010.

The NVM cells 80, 1000, 1100 may respectively utilize the merged second diffusion region 833, 1033 and middle diffusion region 832, 1032, the n-well 1080 or the VTH adjustment implantation region 1090 to prevent leakage current from flowing through the second gate 810, 1010 and the second gate oxide layer 811, 1011 to the I/O well 820, 1020. This ensures that programming and reading of the NVM cells 80, 1000, 1100 in respective arrays may be performed without failures due to insufficient programming voltage at nodes far from the terminal at which the programming voltage is applied.

Those skilled in the art will readily observe that numerous modifications and alterations of the device and method may be made while retaining the teachings of the invention.

What is claimed is:

1. A one-time-programmable memory device comprising:
    a one-time-programmable memory cell array comprising a plurality of memory cells, wherein each memory cell of the plurality of memory cells arranged at an intersection of a bit line and a word line comprises:
        a first gate formed on a surface of the substrate utilizing a first conductivity type;
        a second gate formed on the surface of the substrate;
        a first diffusion region of a second conductivity type different than the first conductivity type formed on a side of the first gate;
        a second diffusion region of the second conductivity type formed on another side of the second gate opposite to the first diffusion region; and
        a middle diffusion region of the second conductivity type formed between the first gate and the second gate;
    a boost capacitor; and
    a programming verification circuit coupled to each memory cell of the one-time-programmable memory cell array for verifying that conduction current of programmed memory cells of the plurality of memory cells is greater than a predetermined current level after programming;
    wherein the second diffusion region merges with the middle diffusion region under the second gate, the first diffusion region is separate from the middle diffusion region, and each boost capacitor isolates leakage current of a corresponding programmed memory cell.

2. The one-time-programmable memory device of claim 1, wherein doping concentration of the first conductivity type in the substrate corresponds to a thick gate oxide device doping concentration.

3. The one-time-programmable memory device of claim 1, wherein the second gate has length equaling a minimum gate length of core devices.

4. The one-time-programmable memory device of claim 1, further comprising:
    a first gate dielectric formed between the substrate and the first gate; and
    a second gate dielectric formed between the substrate and the second gate.

5. The one-time-programmable memory device of claim 1, wherein the second diffusion region is intrinsically merged with the middle diffusion region.

6. A one-time-programmable memory device comprising:
    a one-time-programmable memory cell array comprising a plurality of memory cells, wherein each memory cell of the plurality of memory cells arranged at an intersection of a bit line and a word line comprising:
        a first gate formed on a surface of the substrate utilizing a first conductivity type;
        a second gate formed on the surface of the substrate;
        a first diffusion region of a second conductivity type different than the first conductivity type formed on a side of the first gate;
        a middle diffusion region of the second conductivity type formed between the first gate and the second gate; and
        a threshold adjustment implantation region of the second conductivity type formed under the second gate and the middle diffusion region;
    a boost capacitor; and
    a programming verification circuit coupled to each memory cell of the one-time-programmable memory cell array for verifying that conduction current of programmed memory cells of the plurality of memory cells is greater than a predetermined current level after programming;
    wherein each boost capacitor isolates leakage current of a corresponding programmed memory cell.

7. The one-time-programmable memory device of claim 6, wherein doping concentration of the first conductivity type in the substrate corresponds to a thick gate oxide device doping concentration.

8. The one-time-programmable memory device of claim 6, wherein the second gate has length equaling a minimum gate length of core devices.

9. The one-time-programmable memory device of claim 6, further comprising:
   a first gate dielectric formed between the substrate and the first gate; and
   a second gate dielectric formed between the substrate and the second gate.

10. The one-time-programmable memory device of claim 1, wherein each memory cell of the plurality of memory cells is a resistance adjustable device.

11. The one-time-programmable memory device of claim 10, wherein the resistance adjustable device is a metal-oxide-semiconductor capacitor.

12. The one-time-programmable memory device of claim 11, wherein the metal-oxide-semiconductor capacitor is a short channel source-drain region merged type capacitor.

13. The one-time-programmable memory device of claim 6, wherein each memory cell of the plurality of memory cells is a resistance adjustable device.

14. The one-time-programmable memory device of claim 13, wherein the resistance adjustable device is a metal-oxide-semiconductor capacitor.

15. The one-time-programmable memory device of claim 14, wherein the metal-oxide-semiconductor capacitor is a short channel source-drain region merged type capacitor.

* * * * *